(12) United States Patent
Guo

(10) Patent No.: US 7,307,016 B1
(45) Date of Patent: Dec. 11, 2007

(54) METHOD OF PROCESSING METAL SURFACE IN DUAL DAMASCENE MANUFACTURING

(75) Inventor: Qiang Guo, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 11/448,034

(22) Filed: Jun. 7, 2006

(51) Int. Cl.
*H01L 21/4763* (2006.01)
(52) U.S. Cl. ............................. 438/638; 257/E21.579
(58) Field of Classification Search ................ 438/637, 438/638
See application file for complete search history.

(56) References Cited

U.S. PATENT DOCUMENTS 6,809,028 B2 * 10/2004 Chen et al. ................. 438/637

2005/0107274 A1 * 5/2005 Daviot ....................... 510/175

* cited by examiner

*Primary Examiner*—W. David Coleman
(74) *Attorney, Agent, or Firm*—Rosenberg, Klein & Lee

(57) ABSTRACT

A processing method for the metal surface in a dual damascene manufacturing is applied to a dual damascene semiconductor structure. The dual damascene semiconductor structure has a metal structure and a spin-on-dielectric (SOD) layer formed on the metal structure, wherein the SOD layer has at least one opening exposing a partial surface of the metal structure. Before the opening is filled, the monoxide on the exposed surface is first removed, then the exposed surface is treated by the plasma at an angle inclined to an axis perpendicular to the exposed surface. The processing method provided in the present invention can avoid the exposed surface being damaged by the plasma and improve the adhesion force between the exposed metal surface and the stuff.

9 Claims, 2 Drawing Sheets

METHOD OF PROCESSING METAL SURFACE IN DUAL DAMASCENE MANUFACTURING

BACKGROUND OF THE INVENTION

1. Field of the Invention

The present invention relates to a method of processing the via in a dual damascene manufacturing. More specifically, the present invention discloses a method of processing the via in a Cu/Spin-on-dielectric (Cu/SOD) dual damascene manufacturing to avoid Cu peeling.

2. Description of the Prior Art

In Cu/SOD dual damascene manufacturing, the major factors to be considered are Cu oxidation and Cu peeling on the bottom surface of the via. Usually the Cu oxidation on the bottom surface of the via can be removed efficiently by using Reactive-Pre-Clean (RPC); on the other hand, the adhesion force between Cu and SOD can be efficiently improved by using Ar plasma treatment.

However, the above-mentioned two procedures cannot match up. If the RPC is performed first, the follow-up Ar plasma treatment will ordinarily increase the via resistance, and then decrease the yield. The drawback of the foregoing order mainly arises from the perpendicular direction of the Ar plasma with respect to the bottom surface of the via in the Ar plasma treatment, therefore damages the Cu surface. On the other hand, if the Ar plasma treatment is performed first, the follow-up RPC will reduce the adhesion force between Cu and SOD. Moreover, Cu on the bottom surface of the via will splash on the side wall of the via and then soon spread into the intermetal dielectric layer and cause the electric leakage of the intermetal dielectric layer.

Therefore there is the need for improvement in the method of processing the via in a dual damascene manufacturing.

SUMMARY OF THE INVENTION

To achieve these and other advantages and in order to overcome the disadvantages of the conventional method in accordance with the purpose of the invention as embodied and broadly described herein, the present invention provides a method of Ar plasma treatment in a Cu/SOD dual damascene manufacturing, in which the Ar plasma is proceeded in an inclined direction to lower the probability of damage to Cu surface.

An object of the present invention is to provide a processing method in Cu/SOD dual damascene manufacturing to avoid the electric leakage of the intermetal dielectric layer caused by RPC in which the RPC is performed before the Ar plasma treatment. It can avoid the electric leakage of the intermetal dielectric layer and lower the probability of damage to Cu surface at the same time.

To achieve the above objects, a method of processing the metal surface of the present invention applied to a structure of dual damascene semiconductor comprising a metal structure and a SOD layer formed on the metal structure having at least one opening which exposes a part of the surface of the metal structure is proposed. First, before the opening is stuffed, the monoxide on the exposed surface is removed. Then the exposed surface is treated with plasma at an angle inclined to the axis perpendicular to the exposed surface, wherein the inclined angle is related to the size of the opening. It can avoid the exposed surface being damaged by the plasma and improve the adhesion force between the exposed surface of metal and the stuff.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
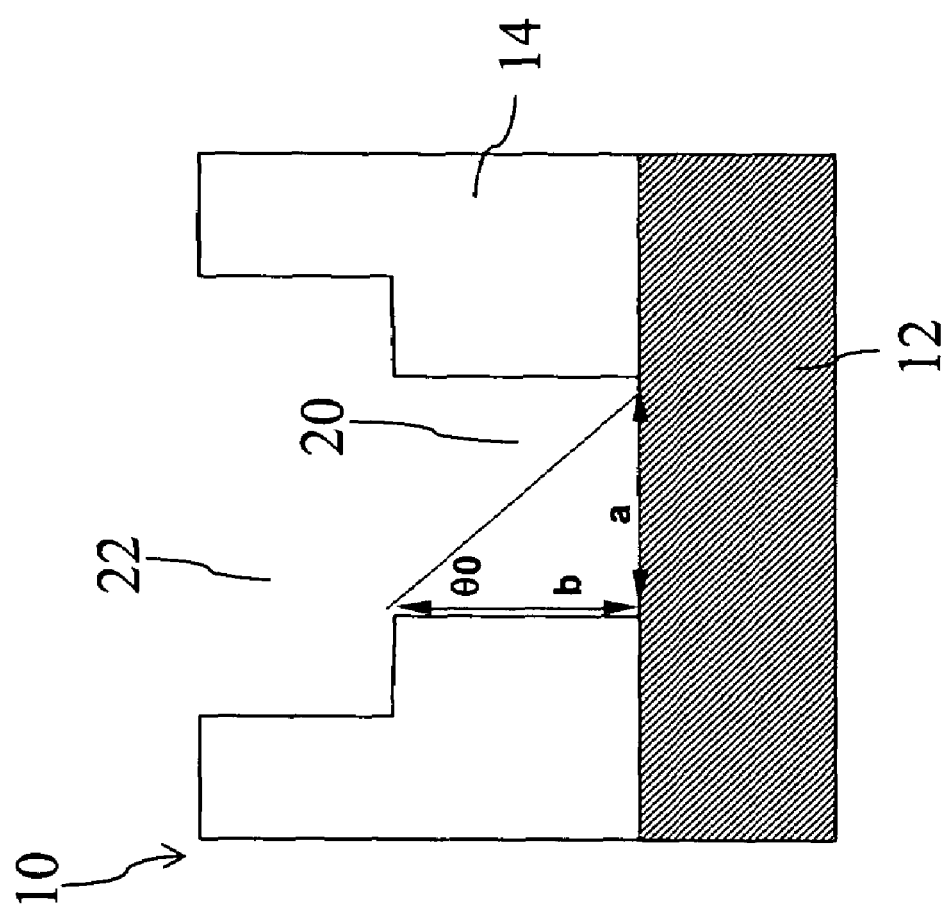
FIG. 1 is a cross sectional view of the structure of a semiconductor according to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The present invention provides a method of processing the Cu surface in a dual damascene manufacturing, which is applied to a dual damascene semiconductor structure having at least one Cu line structure and a SOD layer formed on the Cu line structure. The SOD layer has at least one via which exposes a part of surface of the Cu line structure. The method of processing the Cu surface comprises the following steps: removing CuO on the part surface, for example by RPC, and then treating the part surface by Ar plasma at an angle inclined to the axis perpendicular to the surface.

Refer to FIG. 1, a dual damascene structure 10 comprising a via and a trench is provided. The dual damascene structure 10 comprises a metal line structure 12 on a substrate (not shown) and a low-k dielectric layer 14 covering the metal line structure 12 and the substrate. The part surface of the metal line structure is exposed. At lowest two opening patterns arranged in an up-and-down position are formed on the exposed metal line structure 12 and in the low-k dielectric layer 14. In the embodiment, the two opening patterns are the pattern of via 20 and the pattern of trench 22 respectively. The via 20 beneath has a smaller opening and the trench 22 on the top of the via 20 has a bigger opening. The material of the metal line structure is Cu for the most part. The low-k dielectric layer 14 is mainly composed of organic polymeric materials or $SiO_2$, and is formed on the metal line structure 12 by spin coating, such as Spin-On Polymer (SOP), FLARE, SILK, PARYLENE and/or PAE-II, SiO2, FSG or USC. The patterns of via 20 and trench 22 in the low-k dielectric layer 14 could be formed by the general dual damascene manufacturing, no matter the via or the trench is formed first.

Moreover, the size of the via 20 is defined for convenience in the following description. In the present embodiment, the length of the bottom surface of the via 20, which is also the exposed surface of the metal line structure 12, is represented by "a". The height of the side wall of the via 20 is represented by "b". The angle "$\theta_0$" represents $\tan^{-1}(a/b)$, the arc tangent of the ratio of the length of part surface and the height of the side wall. Besides, the height of the side wall "b" is approximately perpendicular to the part surface of the metal line structure 12.

When the structure of the dual damascene 10 is accomplished, some processing such as removing the oxide on the exposed surface of the metal line structure 12 or improving the adhesion force between the exposed surface of the metal line structure 12 and the stuff must be taken before the via and the trench are filled. In the present embodiment, the pre-clean procedure is first proceeded to remove the oxide, like CuO on the exposed surface of the metal line structure.

Figure 2:
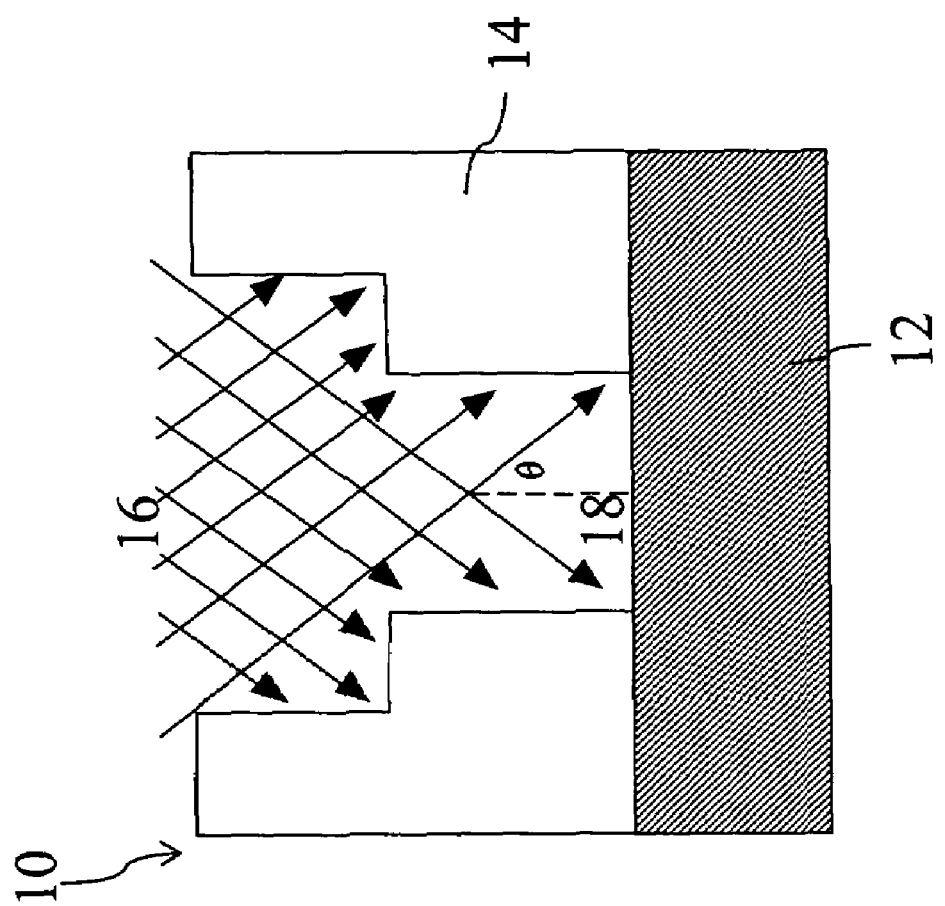
FIG. 2 is a cross sectional view illustrating the processing method applied to a semiconductor according to an embodiment of the present invention.

After that, please refer to FIG. 2, the exposed surface of the metal line structure is treated with Ar plasma 16. To avoid the plasma treatment perpendicular to the part surface of the metal line structure 12 damaging the metal surface, the Ar plasma 16 treats at an angle inclined to the surface of the metal line structure 12. In the present embodiment, the axis 18 perpendicular to the surface of the metal line structure 12 is taken as an example for convenience, and the inclined angle of the Ar plasma 16 relative to the axis 18 is illustrated as "$\theta$". According to the foregoing description, the Ar plasma 16 enters the surface of the via at angle "$\theta$" from both sides of the axis 18, in other words, the axis 18 is the diagonal of the two forward directions of Ar plasma 16. In order to further decrease the damage of the metal surface from the plasma treatment, the inclined angle "$\theta$" is larger than the angle "$\theta_0$" in the present embodiment.

To conclude, the present invention first removes the metal oxide, and next advances the adhesion force of the metal surface. The removal of the metal oxide is accomplished by the normal RPC, and the advance of the adhesion force of the metal surface is achieved by Ar plasma treatment with an inclined angle, wherein the angle is related to the size of the semiconductor structure to ensure that the metal surface will not be damaged during the plasma treatment easily.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A processing method for a metal surface in a dual damascene manufacturing, comprising:

providing a dual damascene semiconductor structure which has at least one metal structure and a spin-on-dielectric (SOD) layer formed on the metal structure, wherein the SOD layer has at least one opening which exposes a partial surface of the metal structure;

removing the monoxide on the partial surface; and treating the partial surface by plasma at an angle inclined to an axis perpendicular to the partial surface.

2. The processing method of claim 1, wherein the opening has a side wall with a height, the partial surface has an opening length, and the inclined angle is larger than an arc tangent of a ratio of the opening length and the height.

3. The processing method of claim 1, wherein the plasma is Ar plasma.

4. The processing method of claim 1, wherein the metal structure is a Cu line structure.

5. The processing method of claim 1, wherein the SOD layer has a low dielectric constant.

6. The processing method of claim 2, wherein the side wall of the opening is parallel to the axis.

7. A processing method for a copper surface in a dual damascene manufacturing, comprising:

providing a dual damascene semiconductor structure which has at least one Cu line structure and a spin-on-dielectric (SOD) layer formed on the Cu line structure, wherein the SOD layer has at least one via which exposes a partial of the Cu line structure;

removing CuO on the partial surface; and treating the partial surface by Ar plasma at an angle inclined to an axis perpendicular to the partial surface.

8. The processing method of claim 7, wherein the via has a side wall with a height, the partial surface has an opening length, and the inclined angle is larger than an arc tangent of a ratio of the opening length and the height.

9. The processing method of claim 7, wherein the removing step is a reactive pre-cleaning procedure.

* * * * *